US009054813B2

(12) United States Patent
Margalit et al.

(10) Patent No.: US 9,054,813 B2
(45) Date of Patent: Jun. 9, 2015

(54) OPTICAL TRANSCEIVER WITH ISOLATED MODULATOR CONTACTS AND/OR INPUTS

(71) Applicants: Near Margalit, Westlake Village, CA (US); Mark Heimbuch, Chatsworth, CA (US); Sheng Zhong Zhang, Chatsworth, CA (US)

(72) Inventors: Near Margalit, Westlake Village, CA (US); Mark Heimbuch, Chatsworth, CA (US); Sheng Zhong Zhang, Chatsworth, CA (US)

(73) Assignee: Source Photonics (Chengdu) Co. Ltd., Chengdu (CN)

( * ) Notice: Subject to any disclaimer, the term of this patent is extended or adjusted under 35 U.S.C. 154(b) by 203 days.

(21) Appl. No.: 13/824,340

(22) PCT Filed: Mar. 13, 2013

(86) PCT No.: PCT/CN2013/072541
§ 371 (c)(1),
(2) Date: Mar. 15, 2013

(87) PCT Pub. No.: WO2014/139103
PCT Pub. Date: Sep. 18, 2014

(65) Prior Publication Data
US 2015/0030339 A1    Jan. 29, 2015

(51) Int. Cl.
*H04B 10/00* (2013.01)
*H04B 10/50* (2013.01)
*H01S 5/00* (2006.01)
*H04B 10/516* (2013.01)
*H04J 14/00* (2006.01)

(52) U.S. Cl.
CPC ............... *H04B 10/506* (2013.01); *H01S 5/00* (2013.01); *H04B 10/516* (2013.01); *H04J 14/00* (2013.01)

(58) Field of Classification Search
USPC .......................... 398/83, 192–198; 372/50.12
See application file for complete search history.

(56) References Cited

U.S. PATENT DOCUMENTS

| | | | | |
|---|---|---|---|---|
| 4,903,275 A | * | 2/1990 | Ettenberg et al. | 372/50.123 |
| 5,151,915 A | * | 9/1992 | Paoli | 372/50.122 |
| 5,267,255 A | * | 11/1993 | Paoli | 372/50.22 |
| 5,455,429 A | * | 10/1995 | Paoli et al. | 257/20 |
| 5,608,753 A | * | 3/1997 | Paoli et al. | 372/50.1 |
| 6,191,464 B1 | * | 2/2001 | Barnard | 257/427 |
| 6,452,220 B1 | | 9/2002 | Morse et al. | |
| 6,707,589 B2 | | 3/2004 | Bostak et al. | |
| 6,825,964 B2 | | 11/2004 | Singh et al. | |
| 6,999,489 B2 | | 2/2006 | Peters | |
| 7,010,179 B2 | | 3/2006 | Hatta et al. | |
| 7,035,486 B2 | * | 4/2006 | Griffin et al. | 385/3 |
| 7,199,441 B2 | | 4/2007 | Shimizu et al. | |

(Continued)

*Primary Examiner* — Agustin Bello
(74) *Attorney, Agent, or Firm* — Andrew D. Fortney; Central California IP Group, P.C.

(57) ABSTRACT

A multi-channel optical transmitter generally includes a first light source configured to emit light of a first wavelength, a second light source configured to emit light of a second wavelength, a first modulator configured to modulate the light of the first wavelength, and a second modulator configured to modulate the light of the second wavelength. The first modulator has a first anode and a first cathode, and the second modulator has a second anode and a second cathode electrically isolated from the first anode and the first cathode. The modulators (and optionally the light sources) are on a common substrate. A method of transmitting optical signals generally includes modulating light emitted from a first light source using a first modulator, and modulating light emitted from a second light source using a second modulator, where the first modulator receives a first modulation signal, and the second modulator receives a second modulation signal electrically isolated from the first modulation signal.

21 Claims, 7 Drawing Sheets

(56) References Cited

U.S. PATENT DOCUMENTS

| | | | |
|---|---|---|---|
| 7,751,658 B2* | 7/2010 | Welch et al. | 385/14 |
| 8,184,929 B2* | 5/2012 | Kish et al. | 385/1 |
| 8,521,020 B2* | 8/2013 | Welch et al. | 398/27 |
| 8,948,227 B2* | 2/2015 | Margalit et al. | 372/50.12 |
| 2009/0092354 A1* | 4/2009 | Joyner | 385/14 |
| 2012/0183306 A1* | 7/2012 | Inoue | 398/183 |
| 2012/0301152 A1* | 11/2012 | Edwards et al. | 398/135 |
| 2013/0272700 A1* | 10/2013 | Satoh et al. | 398/45 |
| 2014/0185636 A1* | 7/2014 | Margalit | 372/26 |
| 2014/0198816 A1* | 7/2014 | Margalit et al. | 372/45.01 |
| 2014/0233962 A1* | 8/2014 | Kato | 398/183 |
| 2015/0030339 A1* | 1/2015 | Margalit et al. | 398/183 |

* cited by examiner

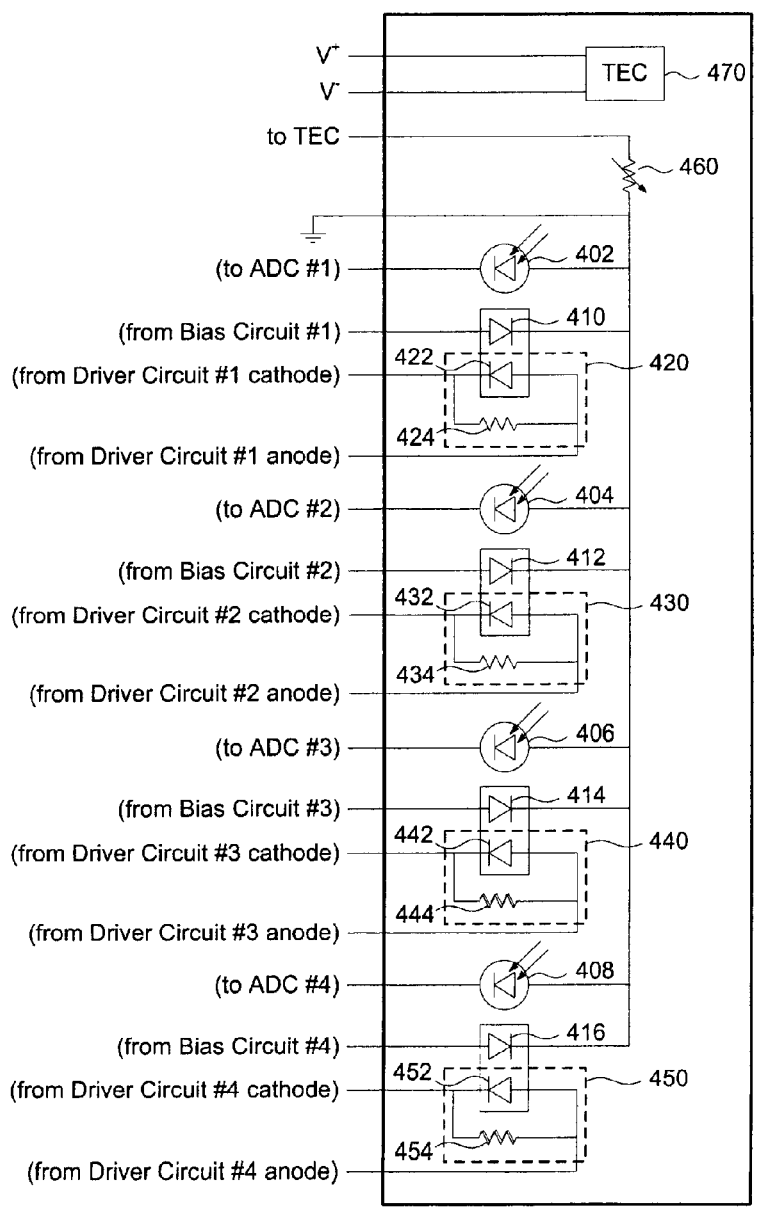

OPTICAL TRANSCEIVER WITH ISOLATED MODULATOR CONTACTS AND/OR INPUTS

RELATED APPLICATION(S)

This application may be related to co-pending U.S. patent application Ser. No. 13/740,140, filed Jan. 11, 2013, the relevant portions of which are incorporated herein by reference.

FIELD OF THE INVENTION

The present invention generally relates to the field of electro-absorption modulated lasers (EMLs). More specifically, embodiments of the present invention pertain to a multi-channel EML with electrically isolated modulator contacts and/or inputs.

DISCUSSION OF THE BACKGROUND

Light-emitting devices such as lasers are useful for optical signal generation in optoelectronic networks. Often, light from a laser is modulated to encode data or information onto the signal. One approach to modulating laser light is electro-absorption modulation (EAM), in which an electric potential applied across the modulator either allows light to pass through the modulator or creates a destructive interference pattern in the light passing into the modulator, thereby turning the light signal off.

To reduce power consumption, the electro-absorption modulated laser (EML) can be modulated differentially. Differential modulation using electro-absorption modulators has either used discrete laser and modulator devices, or, if integrated on a single chip, the modulator section and the laser section generally have common electrical inputs (e.g., contacts). The common electrical inputs typically include the cathode, n-contact(s), and/or ground. The anodes or p-contacts of the laser section and modulator section may be electrically isolated.

However, in a multi-channel transmitter (i.e., having a plurality of paired lasers and modulators), providing a common ground contact for the modulators does not allow for driving each modulator with a differential signal. Thus, a need exists for a multi-channel transmitter in which the modulators for the different channels have input and output contacts that are electrically isolated from each other.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention generally relate to a multi-channel optical transmitter with electrically isolated modulator contacts and/or inputs. The present invention is particularly suitable for MIL applications with two or more channels, where it is advantageous to control the modulator in each channel independently, thereby enabling independent control of optical signal from each laser.

A multi-channel optical transmitter according to embodiments of the present invention generally comprises a first light source (e.g., laser) configured to emit light of a first wavelength, a second light source configured to emit light of a second wavelength, a first modulator configured to receive and modulate the light of the first wavelength to produce a first optical signal, and a second modulator configured to receive and modulate the light of the second wavelength to produce a second optical signal. In the present optical transmitter, the first and second modulators are on a common substrate, the first modulator receives a first modulation signal, and the second modulator receives a second modulation signal electrically isolated from the first modulation signal. The second wavelength of light may be the same as or different from the first wavelength.

A method of transmitting a plurality of optical signals according to embodiments of the present invention generally comprises modulating light of a first wavelength emitted from a first light source (e.g., laser) using a first modulator to produce a first optical signal, and modulating light of a second wavelength emitted from a second light source using a second modulator to produce a second optical signal. The first and second modulators are on a common substrate, the first modulator receives a first modulation signal, and the second modulator receives a second modulation signal electrically isolated from the first modulation signal.

The present invention advantageously provides a multi-channel optical transmitter with electrically isolated modulator inputs and outputs. As such, the present invention provides a device and method that independently control modulators for different channels of a multi-channel optical transmitter made on a single substrate and/or that operates using a differential signal. These and other advantages of the present invention will become readily apparent from the detailed description of various embodiments below.

BRIEF DESCRIPTION OF THE DRAWINGS

FIG. 4A is a circuit diagram showing an exemplary four-channel direct current (DC) transmitter according to the present invention.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "laser," "EML," "light source," "semiconductor laser," and "laser diode" are generally used interchangeably herein, and use of one such term includes the others unless the context of its use clearly indicates otherwise, but these terms are generally given their art-recognized meanings. Also, for convenience and simplicity, the terms "EAM," "light-absorption," "modulator," "modulation region," "modulator section" and "electro-absorption modulator" may be used interchangeably, and use of one such term includes the others unless the context of its use clearly indicates otherwise but these terms are also generally given their art-recognized meanings.

The present invention concerns a multi-channel optical transmitter with electrically isolated modulator inputs and/or contacts. The present invention is particularly suitable for high-speed and/or high-bandwidth laser applications where the ability to independently control modulators within separate channels is particularly advantageous. The invention, in its various aspects, will be explained in greater detail below with regard to exemplary embodiments that achieve or provide a semiconductor optical transmitter with electrically isolated modulator inputs.

An Exemplary Optical Transmitter

In one aspect, the present invention relates to an optical transmitter comprising a multichannel optical source, photodiodes, modulators, waveguides, optical combiner and cooling element. In general (but not necessarily always), each channel has a unique optical source, photodiode, and modulator. In various embodiments, the optical sources may comprise laser diodes, the photodiodes may comprise monitoring photodiodes (e.g., back facet photodiodes), the modulators may comprise electro-absorption modulators (EAMs), the optical combiner may comprise an optical multiplexer (MUX), and the cooling element may comprise a thermoelectric cooler (TEC).

Figure 1:
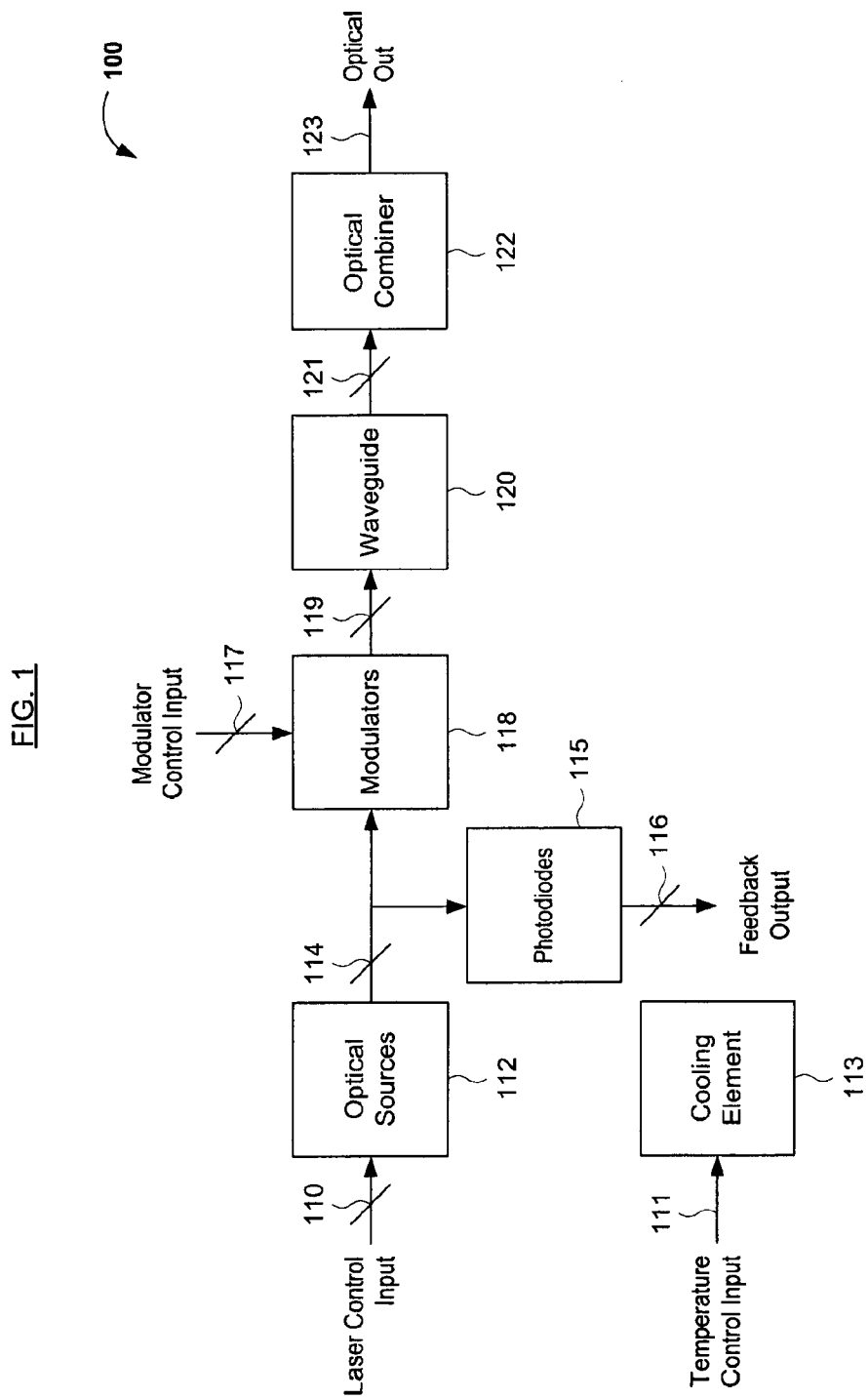
FIG. 1 is a block diagram showing an exemplary multi-channel transmitter according to the present invention.

FIG. 1 illustrates a multichannel optical transmitter 100 embodying the present invention. Optical transmitter 100 comprises an optical source 112 that receives a laser control signal 110 and outputs a multichannel optical signal 114. The laser control signal 110 may comprise a multibit electrical signal or multiple serial electrical signals. The multichannel optical signal 114 generally comprises a plurality of optical signals, each at a different wavelength or wavelength band. The optical transmitter 100 further comprises modulators 118 and photodiodes 115 that each receive signal 114, The modulators 118 are controlled and modulated by a set of modulator input signals 117, and modulators 118 output a set of modulated signals 119 through or along a waveguide section 120 into an optical combiner 122 (e.g., an optical multiplexer). Cooling element 113 receives a temperature control input 111 to cool components of the optical transmitter 100 (e.g., the optical source 112 and modulators 118) towards a predetermined or target operating temperature.

In one embodiment, optical source 112 may comprise one or more laser diodes such as a distributed feedback laser (DFB) or the like. The number of laser diodes may be equal to n in an n-channel optical transmitter, where n is an integer greater than or equal to two. Thus, each channel in the n-channel optical transmitter may have its own laser diode as part of optical source 112. Optical source 112 is controlled by laser control input 110, which may comprise a plurality of single-ended or differential bias voltages or drive currents. Each such bias voltage or drive current may have a preset value or be controlled dynamically. Thus, in one embodiment, the output 114 of optical source 112 has a substantially constant value (e.g., optical power, power density, or intensity). The optical source output 114 can have a power or intensity that varies with the value of laser control input 110.

In some embodiments, modulators 118 may comprise EAMs. The optical transmitter 100 may comprise n modulators, one for each of the n channels. The modulators 118 each receive an independent modulator control input 117, shown as a multibit bus that may comprise n individual single-ended or differential input (e.g., data) signals, where each input signal is electrically isolated from the other n−1 input signals. Thus, each of the modulators 118 may receive its own electrically isolated RF modulation control input 117, and thus be independently controlled. Such independent control signals may especially be advantageous in high speed and/or high-bandwidth laser applications wherein the light output of each channel of an n-channel optical transmitter is different from the light output of another channel of the same n-channel optical transmitter 100.

In one embodiment, photodiodes 115 may comprise back-facet monitors for determining the output power or intensity of the optical source(s) 112. Photodiodes 115 receive at least a portion of the light output 114 from optical source 112. Photodiodes 115 provide feedback relating to the output 114 of the optical source 112 and/or the current operating status of the optical source 112 to a controller or other logic (not shown), which then maintains or adjusts the control input 110 to optical source(s) 112. There may be n photodiodes present, corresponding with the n laser diodes in optical source 112 and/or the n modulators 118.

Waveguide 120 may be any material, such as an optical fiber or semiconductive material transparent to light of the wavelength for a given channel, through which optical signals 119 from modulators 118 may be transmitted. There may be n waveguides in the n-channel optical transmitter 100, generally one for each channel. Thus, the light from each of the n modulators 118 can have a separate waveguide 120 to transmit the optical signals 119. The light signals 121 from waveguide 120 are then combined in optical combiner 122. Optical combiner 122 may be an optical multiplexer (MUX) that is capable of combining optical signals from two or more channels into a single multi-channel optical output 123. For example, optical combiner 122 may be a 4-to-1 optical MUX that receives four separate optical signals (represented by bus 121) and combines the four optical signals into a single optical output 123. Although a 4:1 MUX is described, other multiplexers may be used, such as an 8:1 multiplexer, 16:1 multiplexer, etc.

An Exemplary Two-Channel Optical Transmitter

A further embodiment of the present invention relates to a multi-channel optical transmitter that generally includes a first light source configured to emit light of a first wavelength, a second light source configured to emit light of a second wavelength the same as or different from the first wavelength of light, a first modulator configured to receive and modulate the light from the first light source to produce a first optical signal, and a second modulator configured to receive and modulate the light from the second light source to produce a second optical signal. The first and second modulators are on a common substrate, and optionally, the first and second light sources are on the same substrate as the first and second modulators. The first modulator receives a first modulation signal, and the second modulator receives a second modulation signal electrically isolated from the first modulation signal. In various embodiments, the first wavelength differs from the second wavelength by at least 40 nm.

Figure 2:
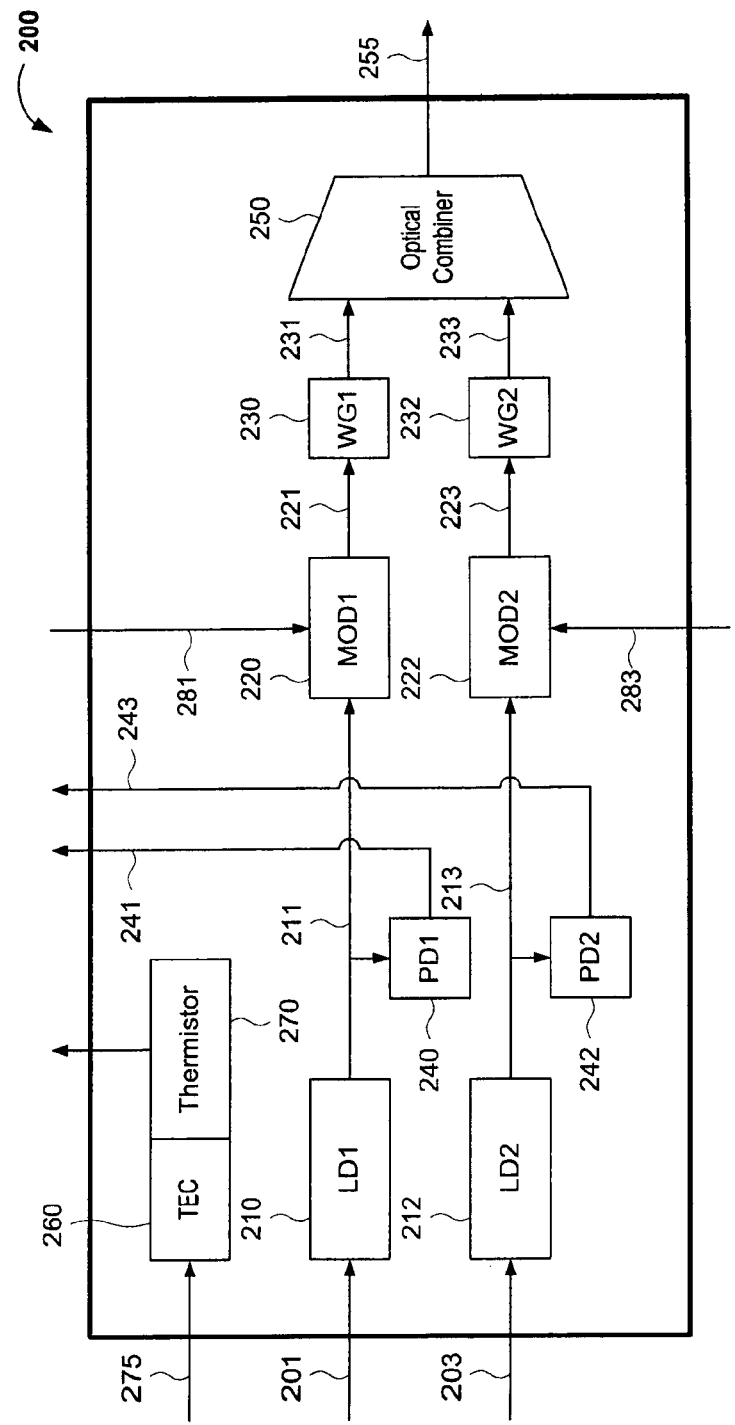
FIG. 2 is a block diagram showing an exemplary two-channel transmitter according to the present invention.

FIG. 2 shows an exemplary two-channel optical transmitter 200. A first channel of the optical transmitter 200 includes a first light source 210, a first modulator 220, a first waveguide 230, and a first photodiode (PD1) 240. A second channel of the optical transmitter 200 includes a second light source 212, a second modulator 222, a second waveguide 232, and a second photodiode (PD2) 242. For example, first and second light sources 210 and 212 may each comprise a laser diode (e.g., LD1 and LD2). In the present multi-channel optical transmitter 200, the first and second light sources 210 and 212 are on a common substrate with the first and second modulators 220 and 222. In one particular implementation, each of the first and second light sources 210 and 212 may comprise a distributed feedback (DFB) laser. In addition, first and second modulators 220 and 222 may each comprise an electroabsorption modulator (EAM) that allows light to pass through the modulator in the absence of an electric field applied across the modulator, but destructively interferes with light transmission when an electric field is applied across the modulator. The first photodiode 240 receives and monitors a portion (e.g., 1-5%) of the light from the first light source 210 having the first wavelength to produce a first feedback signal 241. Similarly, the second photodiode 242 receives and monitors a similar portion (e.g., 1-5%) of the light from the second light source 212 having the second wavelength to produce a second feedback signal 243. The first and second feedback signals 241 and 243 generally transmit information regarding the output power or intensity of the first and second light sources 210 and 212 to a microcontroller (not shown) or other logic that controls the output power or intensity of the first and second light sources 210 and 212. In one embodiment, the first photodiode 240 can be a back-facet monitoring diode, which detects light from the back facet of the first light source 210.

The multi-channel optical transmitter 200 also includes an optical module 250 (e.g., an optical multiplexer or dichroic mirror) that receives and combines the first and second optical signals 231 and 233 from waveguides 230 and 232 for transmission over a single medium 255. The medium 255 may comprise an optical fiber adapted fir use with multi-channel optical signals. For example, the optical fiber may be substantially transparent to light at several wavelengths or wavelength bands.

The multi-channel optical transmitter 200 may further include a thermo-electric cooler (TEC) 260 and a thermistor 270. The TEC 260 maintains or adjusts (e.g., as needed) the operating temperature of the transmitter 200. The thermistor 270 controls operation of the TEC 260 in response to a feeds temperature information to a temperature controller (not shown), which in return provides a bias current 275 (e.g., from a microcontroller or other control logic, not shown) to the TEC 260 to maintain the target temperature.

An Exemplary Four-Channel Optical Transmitter

Figure 3:
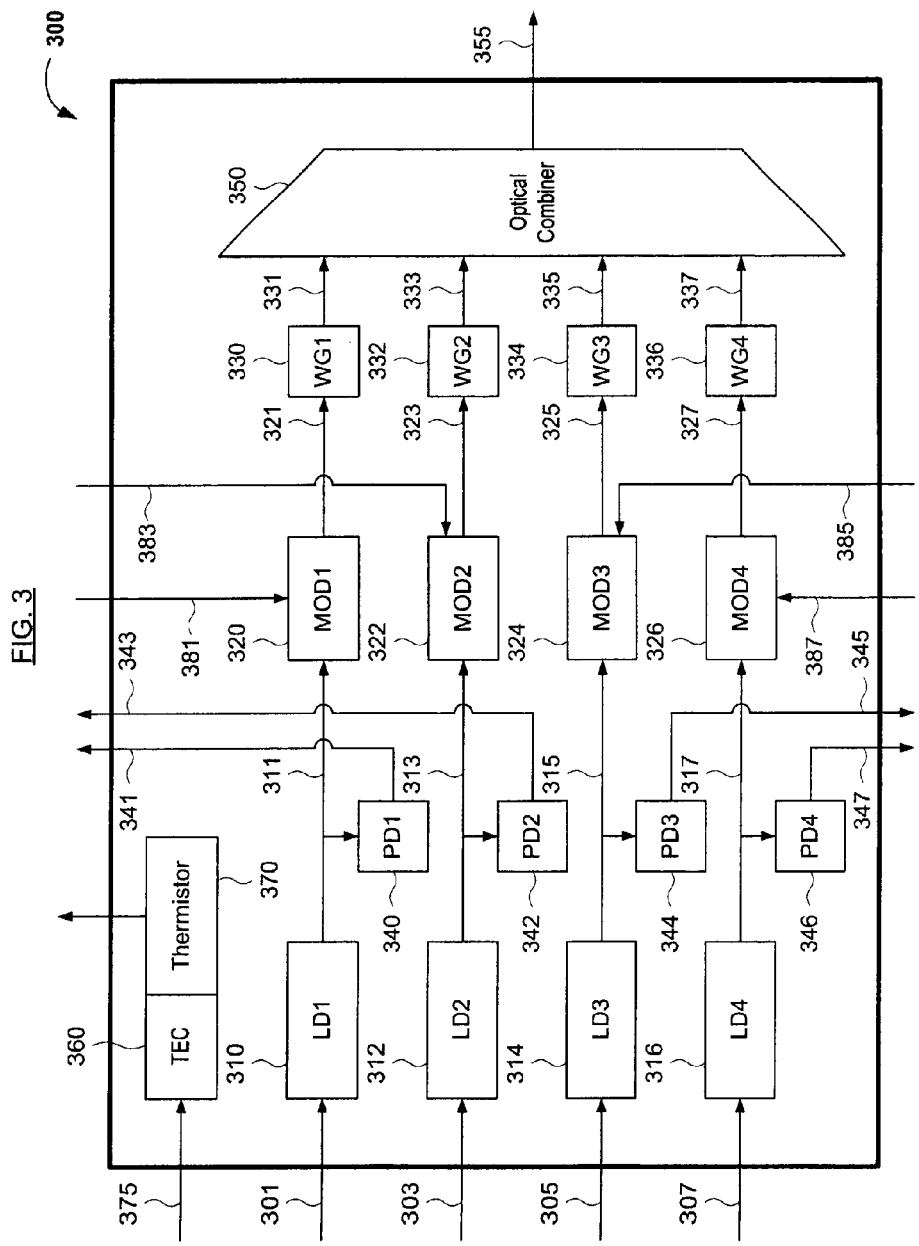
FIG. 3 is a block diagram showing an exemplary monolithic four-channel transmitter according to the present invention.

FIG. 3 shows an exemplary four-channel optical transmitter 300, similar to the two-channel optical transmitter 200 of FIG. 2, but further including third and fourth light sources configured to emit light of third and fourth wavelengths, and third and fourth modulators configured to receive and modulate the light of the third and fourth wavelengths, respectively, to produce third and fourth optical signals. The third and fourth modulators are on the common substrate with at least the first and second modulators, and are preferably also on the same substrate as the first, second, third and fourth light sources. In this embodiment, the third modulator receives a third modulation signal electrically isolated from the first and second modulation signals, and the fourth modulator receives a fourth modulation signal electrically isolated from the first, second and third modulation signals. The third wavelength is the same as or different from the first and second wavelengths, and the fourth wavelength is the same as or different from the first, second and third wavelengths. The first, second, third and fourth wavelengths may be separated from one another by at least 0.02 nm.

More specifically, the four-channel optical transmitter 300 of FIG. 3 comprises first through fourth laser diodes 310, 312, 314 and 316 (e.g., LD1-LD4), first through fourth modulators 320, 322, 324 and 326 (e.g., MOD1-MOD4), and first through fourth waveguides 330, 332, 334 and 336 (e.g., WG1-WG4). Each of the first through fourth modulators 320, 322, 324 and 326 receive a respective single-ended or differential signal 381, 383, 385 or 387, representing the data or other information to be encoded onto optical output signals 321/331, 323/333, 325/335, and 327/337.

The optical signals 331, 333, 335 and 337 output by first through fourth waveguides 330, 332, 334 and 336 may be combined by a single optical combiner (e.g., a 4:1 optical multiplexer or series of dichroic mirrors) 350 for transmission over the optical transmission medium 355 (e.g., optical fiber or cable). Thus, the present multi-channel optical transmitter may further comprise an optical module (e.g., the optical combiner 350) configured to receive and combine the first, second, third and fourth optical signals for transmission over a single optical medium 355.

Each of the light beams 311, 313, 315 and 317 output from first through fourth laser diodes 310, 312, 314 and 316 may be sampled by optical detectors (e.g., photodiodes) 340, 342, 344 and 346, and feedback signals 341, 343, 345 and 347 may convey information relating to the power or intensity of light beams 311, 313, 315 and 317 to a microcontroller or other control logic (not shown) for the four-channel optical transmitter 300. Thus, the present multi-channel optical transmitter may further comprise a third photodiode configured to receive and monitor the light of the third wavelength to produce a third feedback signal, and a fourth photodiode configured to receive and monitor the light of the fourth wavelength to produce a fourth feedback signal.

Similar to the two-channel optical transmitter 200 of FIG. 2, the four-channel optical transmitter 300 of FIG. 3 includes a single cooling element (e.g., TEC 360 and thermistor 370), configured to direct or remove thermal energy from the optical transmitter 300 and maintain or work towards attaining a predetermined or target temperature. The predetermined or target temperature may be set by a user of the optical transmitter 300 (e.g., a host device coupled to and/or controlling the optical transmitter 300).

Exemplary Circuitry for a Four-Channel Optical Transmitter

Figure 4B:
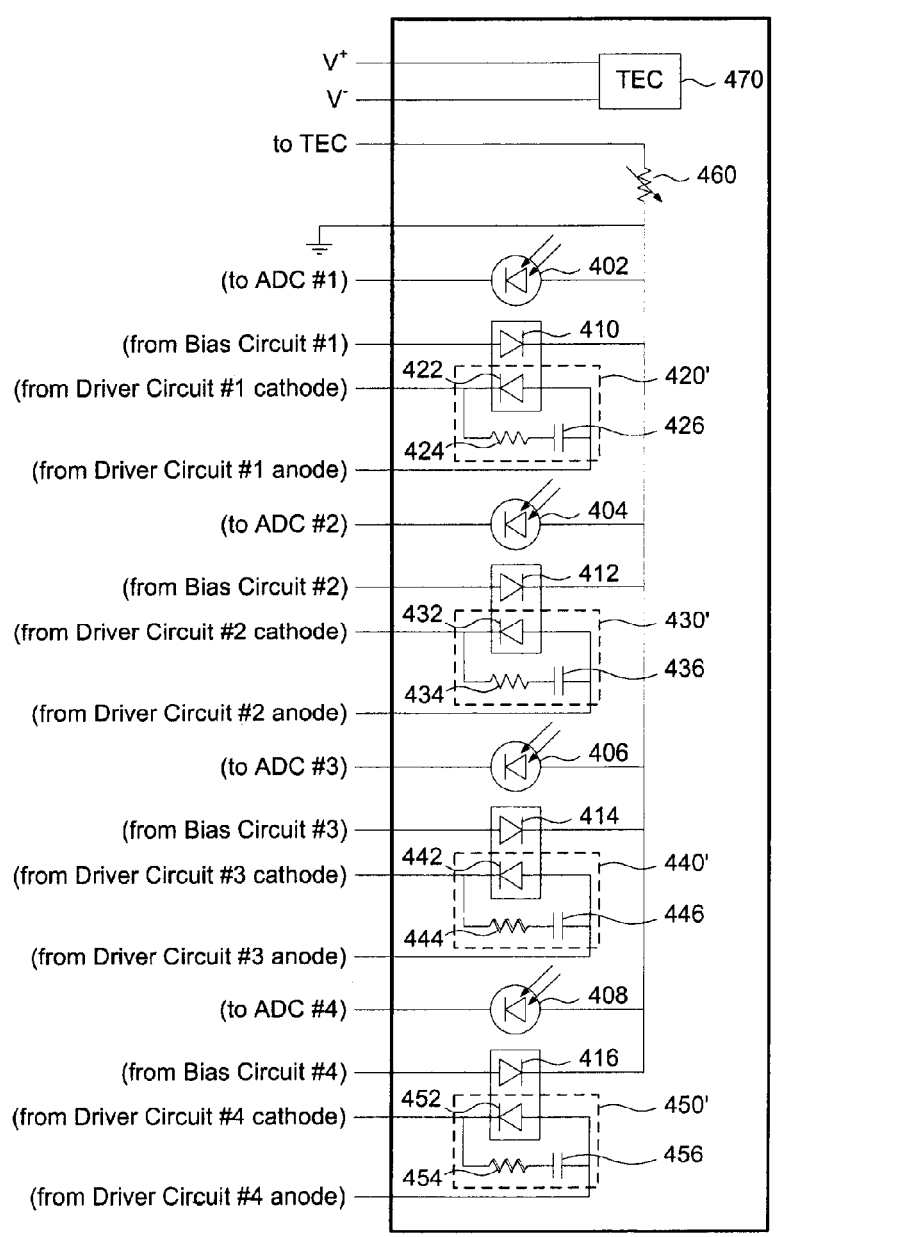
FIG. 4B is a circuit diagram showing an exemplary four-channel alternating current (AC) transmitter according to the present invention.

FIGS. 4A-4B show two exemplary schematics for a four-channel electro-modulated laser (EML) devices 400 and 400', respectively. The embodiment of FIG. 4A is a four-channel EMIL device 400 configured for direct current (DC) termination, and the embodiment of FIG. 4B is a four-channel EML device 400 configured for alternating current (AC) termination.

The DC four-channel EML device 400 of FIG. 4A includes first through fourth laser diodes 410. 412, 414 and 416, first through fourth modulation circuits 420, 430, 440 and 450, thermistor 460, and TEC 470, Together, each laser-modulator pair 410-422, 412-432, 414-442 and 416-452 form an EML for a given optical channel. Each channel may be defined by its characteristic wavelength or wavelength band (e.g., the wavelength may be a maximum for a relatively narrow wavelength band). In one example, the different wavelengths or wavelength band maxima for each channel differ from each other by at least 0.02 nm.

The laser diodes 410, 412, 414 and 416 may comprise a conventional PN or PIN laser diode, formed from a plurality of semiconductor films or layers, each having a different doping level. The laser diodes 410, 412, 414 and 416 are typically edge-emitting diodes, and are generally aligned with the respective or corresponding modulators 422, 432, 442 and 452. Generally, a direct current (DC) signal having a substantially constant value from a bias circuit (e.g., laser bias circuit 531 in FIG. 5) is applied to each laser diode 410, 412, 414 and 416. The value of the signal to each laser diode is sufficient to cause the laser diode to emit light at a power and/or intensity to transmit an optical signal over an optical transmission medium (e.g., an optical fiber) to one or more external devices configured to receive the optical signal.

Modulation circuits 420, 430, 440 and 450 each comprise a respective modulator 422, 432, 442 or 452, and a respective RF termination resistor 424, 434, 444 or 454. The modulators 422, 432., 442 and 452 may each comprise a conventional PN or PIN diode, formed from a plurality of semiconductor films or layers, each having a different doping level. A modulation voltage applied across any one of modulation circuits 420, 430, 440 and 450 by a driver circuit (e.g., modulator driver 528 in FIG. 5) can create a pattern in the light passing into modulator 422, 432, 442 or 452 that prevents the light from passing through to the respective or corresponding waveguide (e.g., waveguide 230, 232, 330, 332, 334 or 336 in FIGS. 2-3). In the absence of a voltage across the modulation circuit, the light passes through the modulator. Relatively rapid switching of the voltage by the modulator driver circuit encodes the optical signal for the given channel. Notably, each modulator 422, 432, 442 and 452 receives an electrically isolated signal from the modulator driver circuit. In one exemplary embodiment, independent bias voltages are applied to modulators 422, 432, 442 and 452 by separate modulator driver circuits (e.g., #1-#4), Resistors 424, 434, 444 and 454 are configured to maintain RE-signal matching with the driver circuit. For example, resistors 424, 434, 444 and 454 may have a value of from 5 to 1000 Ω, depending on the driver output impedance, transmission line impedance, modulator capacitance, package parasitics, etc.

As discussed elsewhere herein, photodiodes 402, 404, 406 and 408 monitor the power and/or intensity of the light output by respective laser diodes 410, 412, 414 and 416. For example, photodiodes 402, 404, 406 and 408 detect light from respective laser diodes 410, 412, 414 and 416 and transmit an analog electrical signal to an analog-to-digital converter (e.g., ADC #1-ADC #4) for conversion to a digital feedback signal for processing by a controller (e.g., controller 526 in FIG. 5). The value of the analog electrical signal and digital feedback signal generally corresponds to the power of a portion of the light emitted by one of the laser diodes 410, 412, 414 and 416.

TEC 470, which may be the same as or similar to cooling element 113 (FIG. 1) and/or TECs 260/360 (FIGS. 2-3), receives bias voltages V+ and V− from a TEC controller (not shown). Thermistor 460 feeds temperature information to the TEC controller. The TEC controller in return adjusts the voltages on V+ and V− to maintain the target temperature.

The AC four-channel EMI, device 400' of FIG. 4B is substantially identical to the DC four-channel EML device 400 of FIG. 4A, except for first through fourth modulation circuits 420', 430', 440' and 450', which further include a respective capacitor 426, 436, 446 or 456. The capacitors 426, 436, 446 and 456 suppress, reduce or eliminate DC current flow through matching resistors 424, 434, 444 and 454 that would otherwise result from the bias voltage across the modulator diodes 422, 432, 442, and 452, thereby reducing power consumption.

An Exemplary Optical Transceiver

The present invention also relates to an exemplary optical transceiver, comprising the present multi-channel optical transmitter, a receiver configured to receive an optical signal and produce an electrical signal, an amplifier configured to receive the electrical signal and produce an amplified signal, and a controller. The controller produces a plurality of laser bias control signals (e.g., for each of the laser diodes) and at least one modulation control signal. In most embodiments, the controller produces a plurality of high speed modulation control signals, an independent, electrically isolated signal for each modulator.

In most embodiments, the transceiver further comprises a laser bias circuit configured to receive feedback signals from the corresponding monitoring photodiode and provide a bias signal to each laser diode. Also, the present transceiver may further comprise a modulator driver circuit configured to provide a set of DC bias voltage and high speed modulation signals to the electrically isolated modulators.

Figure 5:
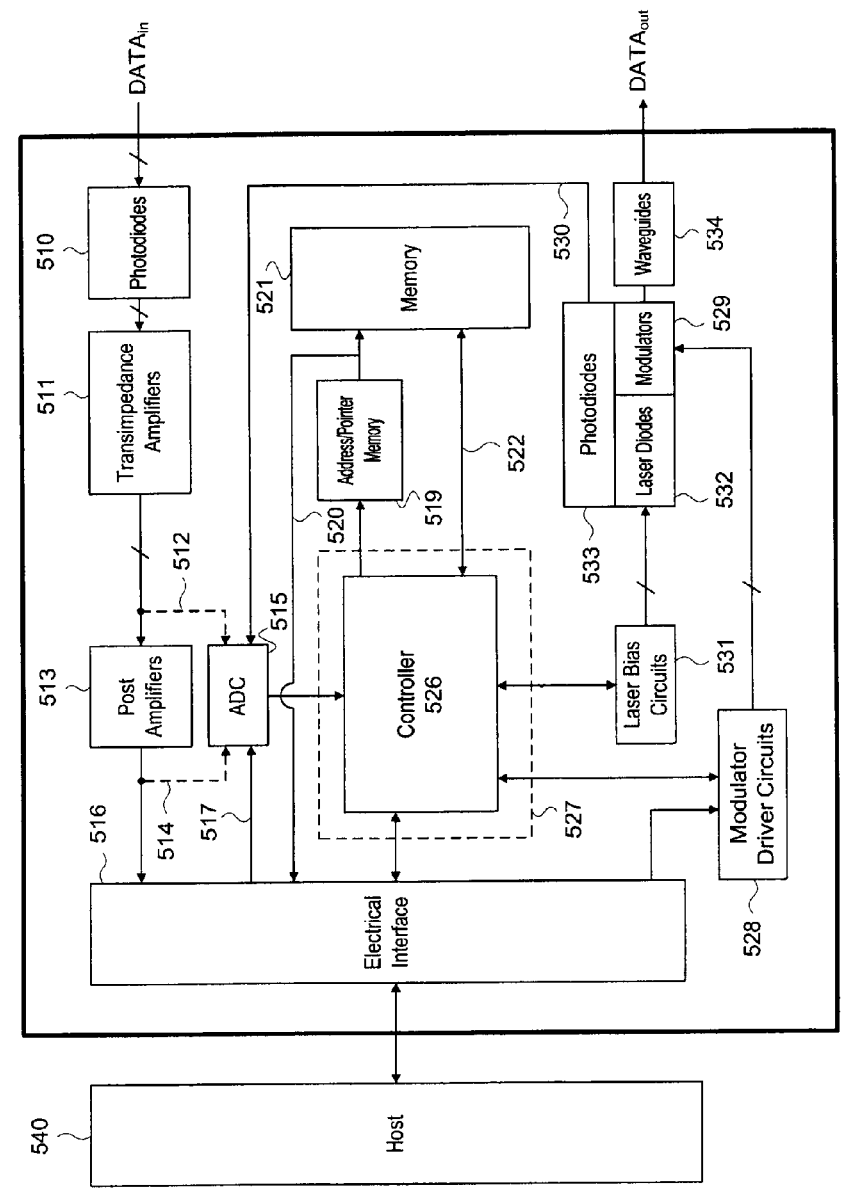
FIG. 5 is a block diagram of an exemplary optical transceiver according to the present invention.

FIG. 5 shows an exemplary multi-channel optical transceiver 500, including electrical interface 516, controller 526, laser bias circuit 531, modulator driver circuit 528, laser diodes 532, modulators 529, waveguides 534, monitoring photodiodes 533, receiving photodiodes 510, transimpedance amplifiers 511, post amplifiers 513, analog-to-digital converter(s) 515, memory 521, and address and/or pointer memory 519. In some embodiments, the optical transceiver 500 may further include a counter, a clock circuit providing a periodic signal to the counter, memory, and/or controller, and an optional battery Driver circuit 531, bias circuit 528, laser diodes 532, modulators 529, waveguides 534, and monitoring photodiodes 533 make up the transmitter portion of the transceiver 500, and receiving photodiodes 510, transimpedance amplifiers 511, and post amplifiers 513 make up the receiver portion of the transceiver 500.

Data and/or control signals from host device 540 may be received at electrical interface 516. Data signals may be sent to the modulator driver circuit 528 for subsequent transmission to modulators 529 and conversion to optical signals that are output through waveguides 534 as $DATA_{out}$. Laser diodes 532 continuously emit a light beam when laser bias circuit 531 applies a sufficiently high current or voltage thereto. Modulators 529 either allow the light from laser diodes 532 to pass through or block such light in response to the data signals from the bias circuit 528.

Monitoring photodiodes 533 monitor the light output from laser diodes 532 and transmit information relating to the output power or intensity of the light to ADC 515, which converts the information to a digital signal for processing by controller 526. ADC 515 may comprise a plurality of ADCs, each receiving a separate input from a different circuit block and providing a separate output to controller 526.

Receiving photodiodes 510 receive optical data and/or control signals $DATA_{in}$ from separate channels in an optical network, and convert the optical signals to electrical signals for amplification by transimpedance amplifiers 511 and post amplifiers 513. Generally, there is one transimpedance amplifier and one post amplifier for each receiver channel.

Memory 521 may store control information, parametric information, and operational information (e.g., warning and/or alarm threshold data) relating to the operation and performance of optical transceiver 500. The locations of such information in memory 521 may be stored in address and/or pointer memory 519. For example, either the host 540 or the controller 526 may store or retrieve parametric or operational information in memory 521. Address/pointer memory 519 identifies the address or location in memory 521 where the parametric or operational information is or will be stored.

Controller 526 is typically a digital circuit, and in many embodiments, a synchronous digital circuit. In such embodiments, optical transceiver 500 comprises clock circuit 524 and counter 525. Counter 525 is useful for certain functions that rely on timing (e.g., counting a certain number of clock cycles before conducting an operation). To determine and/or monitor certain parameters over time, transceiver 500 may maintain real-time clock operation, and thus, provide power to the clock circuit 524 from a battery 523 (when the transceiver is turned of or power is otherwise disconnected from the transceiver 500). Clock signals can be sent directly from clock circuit 524 or indirectly (e.g., though one or more dividers) to other circuit blocks that may operate at least in part synchronously (e.g., memory 521, address/pointer memory 519).

An Exemplary Method of Transmitting Optical Signals

A method of transmitting a plurality of optical signals according to embodiments of the present invention generally comprises modulating light of a first wavelength emitted from a first light source using a first modulator to produce a first optical signal, and modulating light of a second wavelength emitted from a second light source using a second modulator to produce a second optical signal, wherein the first and second modulators are on a common substrate. Generally, the first modulator receives a first modulation signal, and the second modulator receives a second modulation signal electrically isolated from the first modulation signal. In further embodiments, the method further comprises monitoring the light from the light sources using respective photodiodes to produce a plurality of feedback signals, and/or combining the optical signals and transmitting the combined optical signals over a single optical medium. As described elsewhere herein, the wavelengths of light transmitted over the optical medium differ from each other by at least 0.02 nm.

Figure 6:
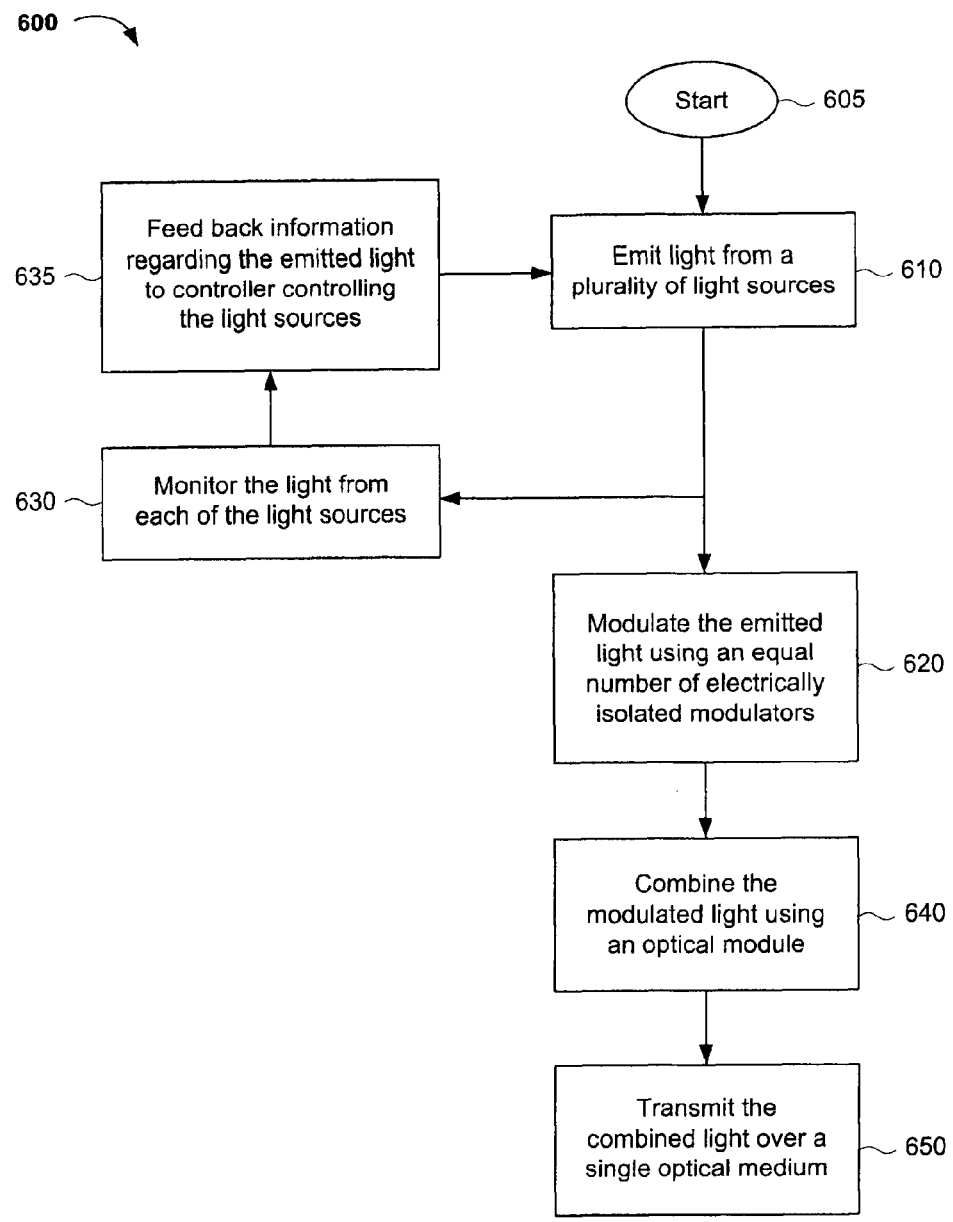
FIG. 6 is a flow chart for an exemplary method of operating a multichannel transmitter according to the present invention.

FIG. 6 shows an exemplary flow diagram 600 for an exemplary method of transmitting multiple optical signals over different channels in an optical or optoelectronic network. The method starts at 605, and at 610, light is emitted from a plurality of light sources. In some embodiments, the light from each different light source has a different wavelength. At 620, the light emitted from the light sources is modulated using a number of modulators equal to the number of light sources.

At the same time, the light from each of the light sources is monitored at 630. Generally, the output power or intensity of the light emitted from each of the light sources is continuously monitored. The information regarding or relating to the light emitted from each of the light sources is fed back to a controller that controls the light sources at 635. For example, a bias current or voltage to each light source is independently controlled by the controller.

At 640, the modulated light (i.e., the optical signals) is combined using an optical module, for example, the optical module may comprise a plurality of waveguides and an optical combiner, such as one or more dichroic mirrors or an optical multiplexer. At 650, the combined optical signals are transmitted over a single optical medium (such as an optical fiber) to one or more devices in an optical or optoelectronic network.

Conclusion/Summary

Thus, the present invention provides a multi-channel EMI, with electrically isolated modulator inputs. By electrically isolating the input to each modulator in each channel, the present invention allows the light output of each channel of the multi-channel EML to be modulated differentially, increasing the speed of optical signal generation and/or reducing the amount of power consumption needed to switch the state of the optical signal.

The foregoing descriptions of specific embodiments of the present invention have been presented for purposes of illustration and description, They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A multi-channel optical transmitter, comprising:
   a first light source configured to emit light of a first wavelength;
   a second light source configured to emit light of a second wavelength, wherein said second wavelength is the same as or different from said first wavelength;
   a first modulator configured to receive and modulate said light of said first wavelength to produce a first optical signal, said first modulator having a first anode, a first cathode, and first and second contacts to the first anode and the first cathode that receive a first differential driver signal from a first driver; and
   a second modulator configured to receive and modulate said light of said second wavelength to produce a second optical signal, said second modulator having a second anode and a second cathode electrically isolated from said first anode and said first cathode, and third and fourth contacts to the second anode and the second cathode that receive a second differential driver signal from a second driver, wherein the third and fourth contacts are electrically isolated from the first and second contacts,
   wherein said first and second modulators are on a common substrate.

2. The multi-channel optical transmitter of claim 1, further comprising:
   a first photodiode configured to receive and monitor said light of said first wavelength to produce a first feedback signal; and
   a second photodiode configured to receive and monitor said light of said second wavelength to produce a second feedback signal.

3. The multi-channel optical transmitter of claim 1, further comprising an optical module configured to receive and combine said first and second optical signals for transmission over a single medium.

4. The multi-channel optical transmitter of claim 1, further comprising:
   a thermo-electric cooler (TEC) configured to adjust an operating temperature of said transmitter; and
   a thermister configured to control operation of said TEC in response to a temperature control input.

5. The multi-channel optical transmitter of claim 1, wherein said first and second light sources comprise laser diodes.

6. The multi-channel optical transmitter of claim 1, wherein said first and second light sources are on said common substrate.

7. The multi-channel optical transmitter of claim 1, wherein said first wavelength differs from said second wavelength by at least 0.02 nm.

8. The multi-channel optical transmitter of claim 1, further comprising:
   a third light source configured to emit light of a third wavelength, wherein said third wavelength is the same as or different from said first and second wavelengths;
   a fourth light source configured to emit light of a fourth wavelength, wherein said fourth wavelength is the same as or different from said first, second and third wavelengths;
   a third modulator configured to receive and modulate said light of said third wavelength to produce a third optical signal, the third modulator having a third anode and a third cathode electrically isolated from said first and second anodes and said first and second cathodes, and fifth and sixth contacts to the third anode and the third cathode that receive a third differential driver signal from a third driver, wherein the fifth and sixth contacts are electrically isolated from the first, second, third and fourth contacts; and
   a fourth modulator configured to receive and modulate said light of said fourth wavelength to produce a fourth optical signal, the fourth modulator having a fourth anode and a fourth cathode electrically isolated from said first, second and third anodes and said first, second and third cathodes, and seventh and eighth contacts to the fourth anode and the fourth cathode that receive a fourth differential driver signal from a fourth driver, wherein the seventh and eighth contacts are electrically isolated from the first, second, third, fourth, fifth and sixth contacts,
   wherein said third and fourth modulators are on said common substrate.

9. The multi-channel optical transmitter of claim 8, wherein said third and fourth light sources comprise laser diodes.

10. The multi-channel optical transmitter of claim 8, wherein said third and fourth light sources are on said common substrate.

11. The multi-channel optical transmitter of claim 8, wherein each of said first, second, third and fourth wavelengths are separated from one another by at least 0.02 nm.

12. The multi-channel optical transmitter of claim 8, further comprising:
   a third photodiode configured to receive and monitor said light of said third wavelength to produce a third feedback signal; and
   a fourth photodiode configured to receive and monitor said light of said fourth wavelength to produce a fourth feedback signal.

13. The multi-channel optical transmitter of claim 8, further comprising an optical module configured to receive and combine said first, second, third and fourth optical signals for transmission over a single medium.

14. A transceiver, comprising:
   the multi-channel optical transmitter of claim 1;
   a receiver configured to receive a third optical signal and produce an analog signal;
   an amplifier configured to receive said analog signal and produce an amplified signal; and
   a controller configured to receive said amplified signal and produce first and second driver control signals and at least one bias control signal.

15. The transceiver of claim 14, further comprising a laser bias circuit configured to receive said first and second bias control signals and transmit a first bias signal to said first light source and a second bias signal to said second light source.

16. The transceiver of claim 14, further comprising a driver circuit configured to receive said at least one modulator driver control signal and apply a first driver signal to said first modulator and a second driver signal to said second modulator.

17. A method of transmitting a plurality of optical signals, comprising:
   transmitting a first differential driver signal from a first driver;
   transmitting a second differential driver signal from a second driver;
   modulating light of a first wavelength emitted from a first light source using a first modulator to produce a first optical signal, said first modulator having a first anode and a first cathode, and first and second contacts to the first anode and the first cathode that receive the first differential driver signal from the first driver; and
   modulating light of a second wavelength emitted from a second light source using a second modulator to produce a second optical signal, said second modulator having a second anode and a second cathode electrically isolated from said first anode and said first cathode, and third and fourth contacts to the second anode and the second cathode that receive the second differential driver signal from the second driver, wherein the third and fourth contacts are electrically isolated from the first and second contacts,
   wherein said first and second modulators are on a common substrate.

18. The method of claim 17, further comprising:
   monitoring said light of said first wavelength using a first photodiode to produce a first feedback signal; and
   monitoring said light of said second wavelength using a second photodiode to produce a second feedback signal.

19. The method of claim 17, further comprising:
   combining said first and second optical signals; and
   transmitting said combined optical signals over a single medium.

20. The method of claim 17, wherein said first wavelength differs from said second wavelength by at least 0.02 nm.

21. The method of claim 17, further comprising:
   transmitting a third differential driver signal from a third driver;
   transmitting a second differential driver signal from a second driver;
   modulating light of a third wavelength emitted from a third light source using a third modulator to produce a third optical signal, said third modulator having a third anode and a third cathode, and fifth and sixth contacts to the third anode and the third cathode that receive the third differential driver signal from the third driver, wherein the fifth and sixth contacts are electrically isolated from the first, second, third and fourth contacts; and
   modulating light of a fourth wavelength emitted from a fourth light source using a fourth modulator to produce a fourth optical signal, said fourth modulator having a fourth anode and a fourth cathode electrically isolated from said first, second and third anodes and said first, second and third cathodes, and seventh and eighth contacts to the fourth anode and the fourth cathode that receive the fourth differential driver signal from the fourth driver, wherein the seventh and eighth contacts are electrically isolated from the first, second, third, fourth, fifth and sixth contacts, wherein said third and fourth modulators are on said common substrate.

\* \* \* \* \*